(12) United States Patent
Okumura

(10) Patent No.: US 10,833,189 B2
(45) Date of Patent: Nov. 10, 2020

(54) SEMICONDUCTOR DEVICE

(71) Applicant: FUJI ELECTRIC CO., LTD., Kawasaki (JP)

(72) Inventor: Keiji Okumura, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 0 days.

(21) Appl. No.: 16/519,517

(22) Filed: Jul. 23, 2019

(65) Prior Publication Data

US 2020/0091339 A1 Mar. 19, 2020

(30) Foreign Application Priority Data

Sep. 14, 2018 (JP) ................... 2018-173120

(51) Int. Cl.
*H01L 29/78* (2006.01)
*H01L 29/16* (2006.01)
*H01L 21/66* (2006.01)
*H01L 29/49* (2006.01)
*H01L 29/423* (2006.01)

(52) U.S. Cl.
CPC .......... *H01L 29/7813* (2013.01); *H01L 22/32* (2013.01); *H01L 29/1608* (2013.01); *H01L 29/4236* (2013.01); *H01L 29/4916* (2013.01)

(58) Field of Classification Search
CPC . H01L 29/7813; H01L 29/1608; H01L 22/32; H01L 29/4916; H01L 29/4236
See application file for complete search history.

(56) References Cited

U.S. PATENT DOCUMENTS 9,748,229 B2 * 8/2017 Hikasa ................ H01L 29/7397

FOREIGN PATENT DOCUMENTS

JP 5-304296 A 11/1993

* cited by examiner

*Primary Examiner* — Anthony Ho

(57) ABSTRACT

In an inactive region of an active region, a gate pad, a gate poly-silicon layer, and a gate finger are provided at a front surface of a semiconductor substrate, via an insulating film. The gate poly-silicon layer is provided beneath the gate pad, sandwiching the insulating film therebetween. The gate pad, the gate poly-silicon layer, a gate finger, gate electrodes of a trench gate structure, a gate finger, and a second measurement pad are electrically connected in the order stated. As a result, the gate electrodes where parasitic resistance occurs and the gate poly-silicon layer where built-in resistance occurs are connected in series between the second measurement pad and the gate pad. A resistance value of the overall gate resistance that is a combined resistance of the built-in resistance and the parasitic resistance may be measured by the second measurement pad.

9 Claims, 17 Drawing Sheets

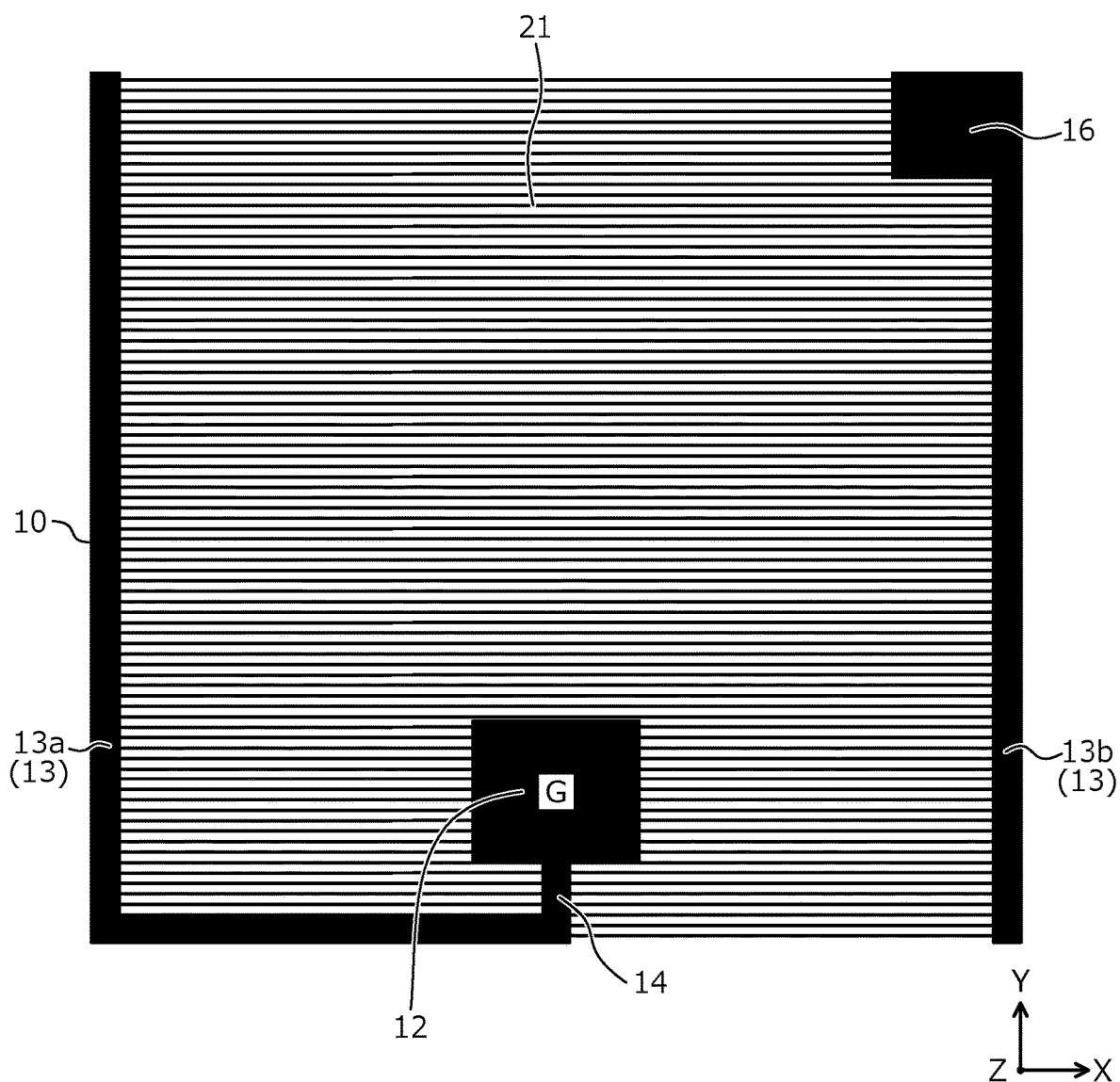

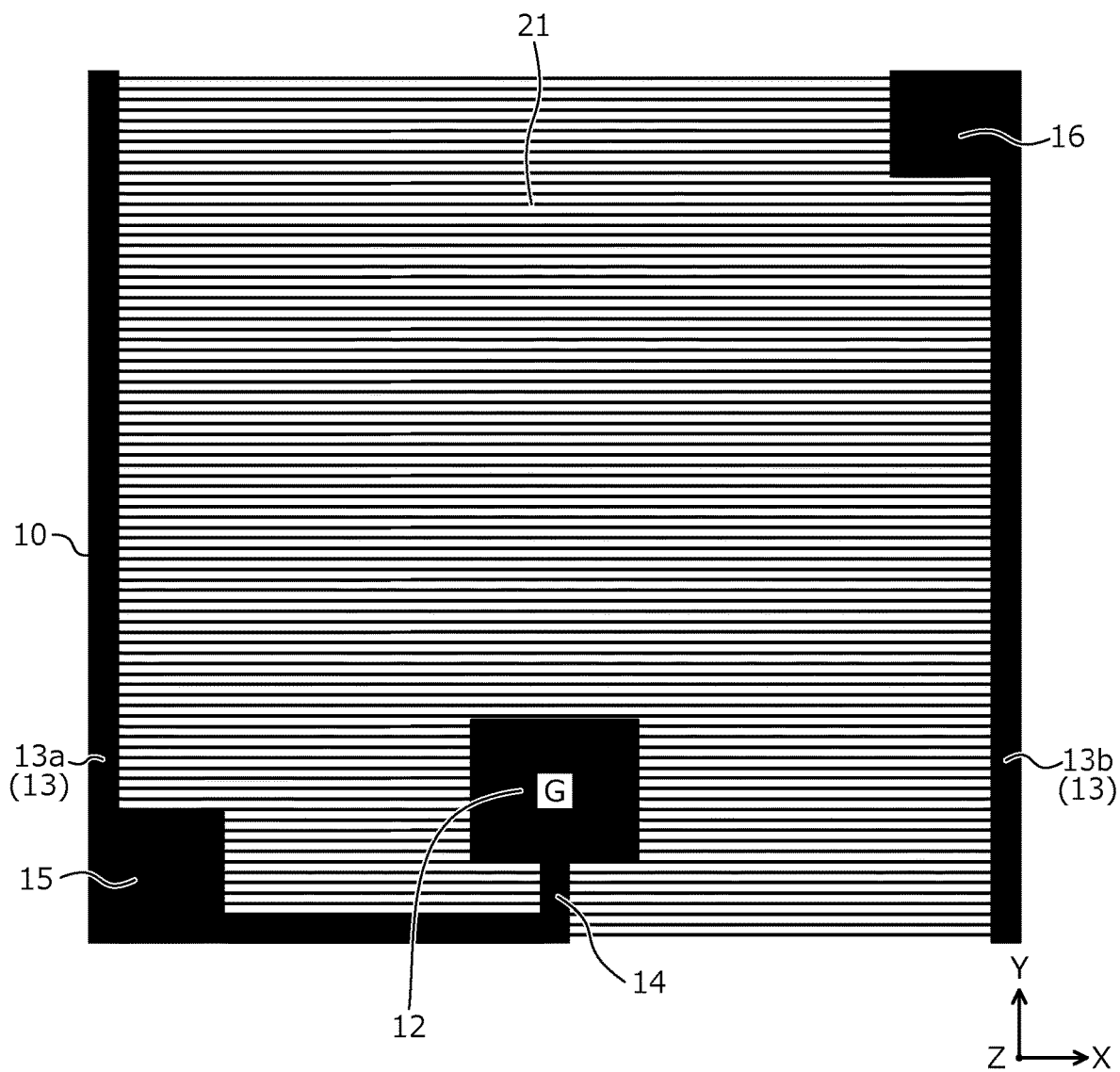

SEMICONDUCTOR DEVICE

CROSS REFERENCE TO RELATED APPLICATIONS

This application is based upon and claims the benefit of priority of the prior Japanese Patent Application No. 2018-173120, filed on Sep. 14, 2018, the entire contents of which are incorporated herein by reference.

BACKGROUND

1. Field

The embodiments discussed herein relate to a semiconductor device.

2. Description of Related Art

Conventionally, in an active region in a MOS (insulated gate constituted by a 3-layer structure including a metal film, an oxide film, and a semiconductor material) semiconductor device, a parasitic resistor is formed by poly-silicon (poly-Si), which is a material of a gate electrode. A resistance value of this parasitic resistor, while varying minimally in a planar gate structure, varies greatly in a trench gate structure as a consequence of variation dependent on the shape of the gate trench and finished dimensions of the trench gate structure. A built-in resistor having a flat plate-like shape and a resistance value that varies minimally and is higher than the resistance value of the parasitic resistor is connected in series between the gate pad and the gate electrode as a commonly known method of controlling variation of the resistance value of the parasitic resistor.

A structure of a conventional semiconductor device will be described taking a metal oxide semiconductor field effect transistor ((MOSFET) MOS field effect transistor having an insulated gate constituted by a 3-layer structure including a metal, an oxide film, and a semiconductor material) as an example. FIGS. 7, 8, and 9 are plan views of a layout when the conventional semiconductor device is viewed from a front surface side of a semiconductor substrate. In FIGS. 8 and 9, a layout of a gate trench 121 is depicted while a portion that is further outward (closer to an edge of a semiconductor substrate 110) than is a gate finger 113 is omitted. FIG. 10 is a circuit diagram depicting an equivalent circuit of the conventional semiconductor device.

The conventional semiconductor device depicted in FIGS. 7 to 10 includes on the front surface of the semiconductor substrate 110, a source pad 111 and a gate pad 112 disposed separated from each other. The source pad 111 is disposed in an effective region 102 that is in an active region 101. The gate pad 112 is disposed in an inactive region 103 that is in the active region 101. The effective region 102 is a region that excludes the inactive region 103 in the active region 101, is a region in which a unit cell (constituent unit of an element) of the MOSFET is disposed, and a region that functions as the MOSFET. The inactive region 103 is a region that does not function as the MOSFET and in which no unit cell of the MOSFET is disposed.

The gate pad 112 is electrically connected to all gate electrodes 123 (FIG. 10) via the gate finger 113 and a gate poly-silicon layer 114. The gate finger 113 is disposed in an edge termination region 104, along a boundary between the active region 101 and the edge termination region 104, has a ring-shape, and surrounds a periphery of the active region 101. The gate electrode 123 is connected to the gate finger 113, at both ends of the gate trench 121 that is provided in a striped-shape extending along a direction parallel to the front surface of the semiconductor substrate 110 (FIGS. 8 and 9). In FIGS. 8 and 9, the gate trench 121 is depicted using a finer line than that for the gate finger 113.

The gate poly-silicon layer 114 where built-in resistance Rg2 occurs and the gate electrode 123 where parasitic resistance Rg1 occurs are connected in series by the gate finger 113. A combined resistance of the built-in resistance Rg2 and the parasitic resistance Rg1 is overall gate resistance Rg3 of the conventional semiconductor device depicted in FIGS. 7 to 10. A resistance value of the gate resistance Rg3 is determined by a resistance value of the built-in resistance Rg2 that is higher than a resistance value of the parasitic resistance Rg1. An electrode pad (hereinafter, measurement pad) 115 for measuring the resistance value, for example, is disposed at a corner portion that corresponds to one vertex of the active region 101 that has a substantially rectangular planar shape and the second measurement pad 115 is connected to the gate finger 113, at the corner portion of the active region 101 (refer to FIG. 8).

As depicted in FIG. 10, connection of the second measurement pad 115 to the gate finger 113 establishes a state in which a region where the built-in resistance Rg2 occurs is connected in series between the gate pad 112 and the second measurement pad 115, enabling the resistance value of the built-in resistance Rg2 to be measured by the second measurement pad 115. Therefore, as described, the resistance value of the built-in resistance Rg2 is set to be higher than the resistance value of the parasitic resistance Rg1 so that the resistance value of the gate resistance Rg3 is determined by the resistance value of the built-in resistance Rg2. As a result, measurement of the resistance value of the built-in resistance Rg2 by the second measurement pad 115 enables selection of the semiconductor substrate (semiconductor chip) 110 for which the overall gate resistance Rg3 is a predetermined resistance value.

Reference character C101 between a gate and a source of each unit cell of the MOSFET disposed in the effective region 102 represents parasitic capacitance occurring at a portion of a gate insulating film (not depicted) along a side wall of the gate trench 121. Reference character C102 represents parasitic capacitance occurring at an interlayer insulating film (not depicted) between the gate finger 113 and the source pad 111. Reference character C103 represents parasitic capacitance occurring at a field oxide film between the gate finger 113 and the front surface of the semiconductor substrate 110.

Reference character C104 represents parasitic capacitance occurring at the field oxide film (not depicted) and the interlayer insulating film between the second measurement pad 115 and the front surface of the semiconductor substrate 110. Reference character C105 represents parasitic capacitance occurring at the field oxide film between the front surface of the semiconductor substrate 110 and a poly-silicon layer (hereinafter, gate poly-silicon layer) 114 contributing to the built-in resistance Rg2. The regions where the parasitic capacitances C101 to C105 occur are connected in parallel between the gate pad 112 and the source pad 111.

A device in which on a single semiconductor substrate having a MOSFET, a resistor made from poly-silicon is formed, and a gate and a source of a MOSFET cell are connected via a source pad and a gate pad that are electrically connected by the resistor has been proposed as a MOSFET in which a resistor made from poly-silicon is disposed on a main surface of a semiconductor substrate, along an edge of the semiconductor substrate (for example, refer to Japanese Laid-Open Patent Publication No. H05-304296 (paragraphs 0018 to 0020, 0024)). In Japanese Laid-Open Patent Publication No. H05-304296, charge accumulated by the parasitic capacitance between the gate and source of the MOSFET is discharged through the resistor made from poly-silicon.

SUMMARY

According to an embodiment, a semiconductor device includes an insulated gate structure provided on a first main surface side of a semiconductor substrate, the insulated gate structure being constituted by a 3-layer structure including a metal film, an oxide film, and a semiconductor material; a gate pad provided at a first main surface of the semiconductor substrate, via an insulating film; a gate finger provided at the first main surface of the semiconductor substrate, via the insulating film, and to which a plurality of gate electrodes constituted by the metal film of the insulated gate structure is electrically connected; a gate poly-silicon layer provided at the first main surface of the semiconductor substrate, via the insulating film, the gate poly-silicon layer electrically connecting the gate pad and the gate finger; and an electrode pad for measuring a first resistance value, the electrode pad being provided at the first main surface of the semiconductor substrate, via the insulating film, and electrically connected to the gate finger. All gate electrodes of the plurality of gate electrodes are electrically connected between a first connection part and a second part of the gate finger, the first connection part connecting the gate finger and the gate poly-silicon layer, the second connection part connecting the gate finger and the electrode pad.

In the embodiment, the insulated gate structure is a trench gate structure that has: a trench from the first main surface of the semiconductor substrate, and one of the plurality of gate electrodes provided in the trench, via a gate insulating film constituted by the oxide film.

In the embodiment, the semiconductor device further includes a second electrode pad for measuring a second resistance value, the second electrode pad being provided at the first main surface of the semiconductor substrate, via the insulating film, and electrically connected to the gate pad, via the gate poly-silicon layer.

In the embodiment, the semiconductor device has as the gate finger, a first gate finger that electrically connects the gate poly-silicon layer and the plurality of gate electrodes, and a second gate finger that electrically connects the plurality of gate electrodes and the electrode pad. The gate pad, the gate poly-silicon layer, the first gate finger, the plurality of gate electrodes, the second gate finger, and the electrode pad are sequentially connected to each other.

In the embodiment, the semiconductor device further includes a poly-silicon layer having an electric potential of the plurality of gate electrodes and provided in the insulating film. The poly-silicon layer is disposed between the electrode pad and the semiconductor substrate.

In the embodiment, the semiconductor device further include a first semiconductor region of the semiconductor substrate that is of a first conductivity type, the first semiconductor region being of a second conductivity type and provided between a plurality of trenches; a second semiconductor region of the first conductivity type and selectively provided in the first semiconductor region; a third semiconductor region provided at a second main surface of the semiconductor substrate; a first electrode electrically connected to the first semiconductor region and the second semiconductor region; a second electrode electrically connected to the third semiconductor region; and a poly-silicon layer having an electric potential of the first electrode and provided in the insulating film. The poly-silicon layer is disposed between the electrode pad and the semiconductor substrate.

In the embodiment, the first resistance value is a combined resistance equal to resistance values of parasitic resistance due to the plurality of gate electrodes and built-in resistance due to the gate poly-silicon layer.

In the embodiment, the second resistance value is a resistance value of built-in resistance due to the gate poly-silicon layer.

In the embodiment, the semiconductor substrate contains silicon carbide.

Objects, features, and advantages of the present invention are specifically set forth in or will become apparent from the following detailed description of the invention when read in conjunction with the accompanying drawings.

BRIEF DESCRIPTION OF THE DRAWINGS

FIG. 4A is a cross-sectional view depicting an example of a structure of the semiconductor device according to a second embodiment.

FIG. 4B is a cross-sectional view depicting an example of the structure of the semiconductor device according to the second embodiment.

DESCRIPTION OF EMBODIMENTS

Figure 10:
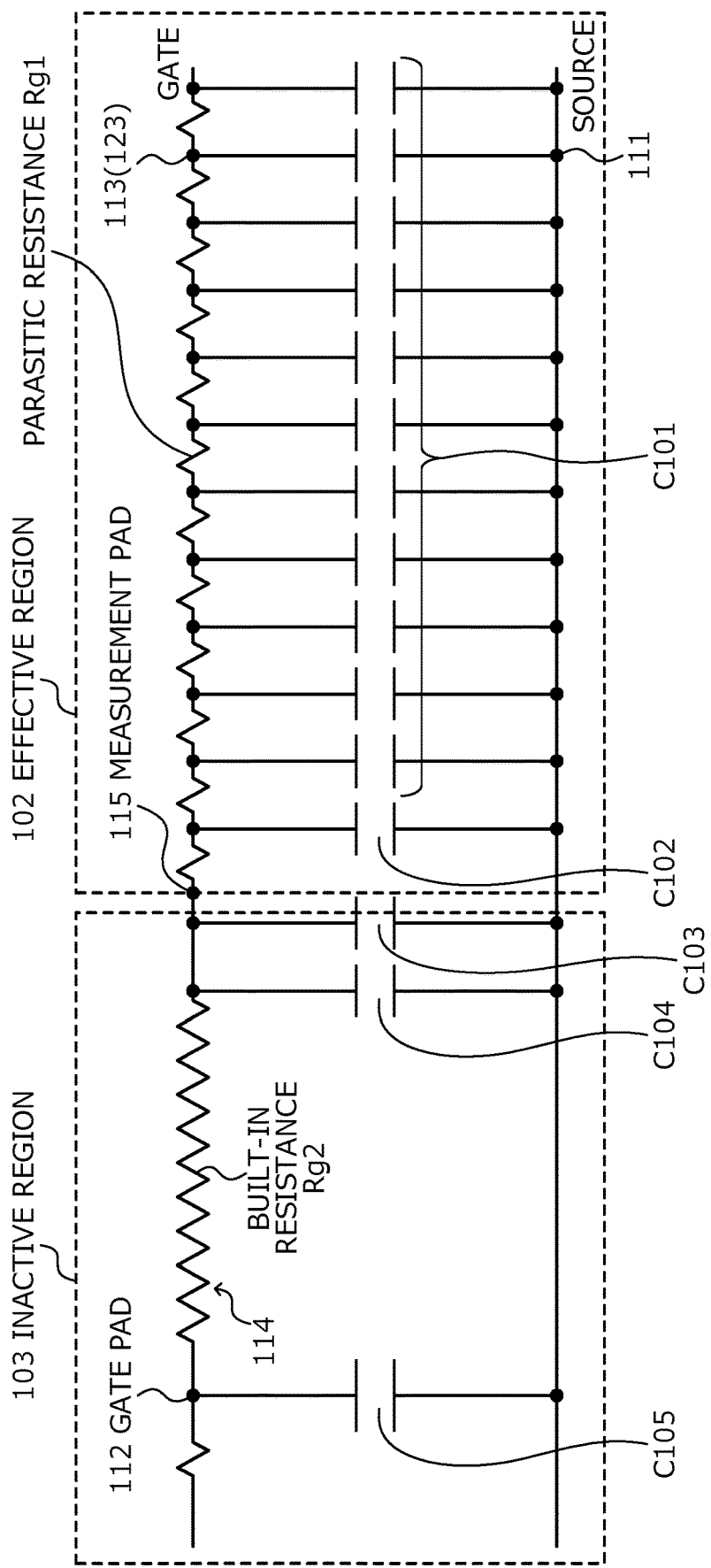
FIG. 10 is a circuit diagram depicting an equivalent circuit of the conventional semiconductor device.
Figure 11:
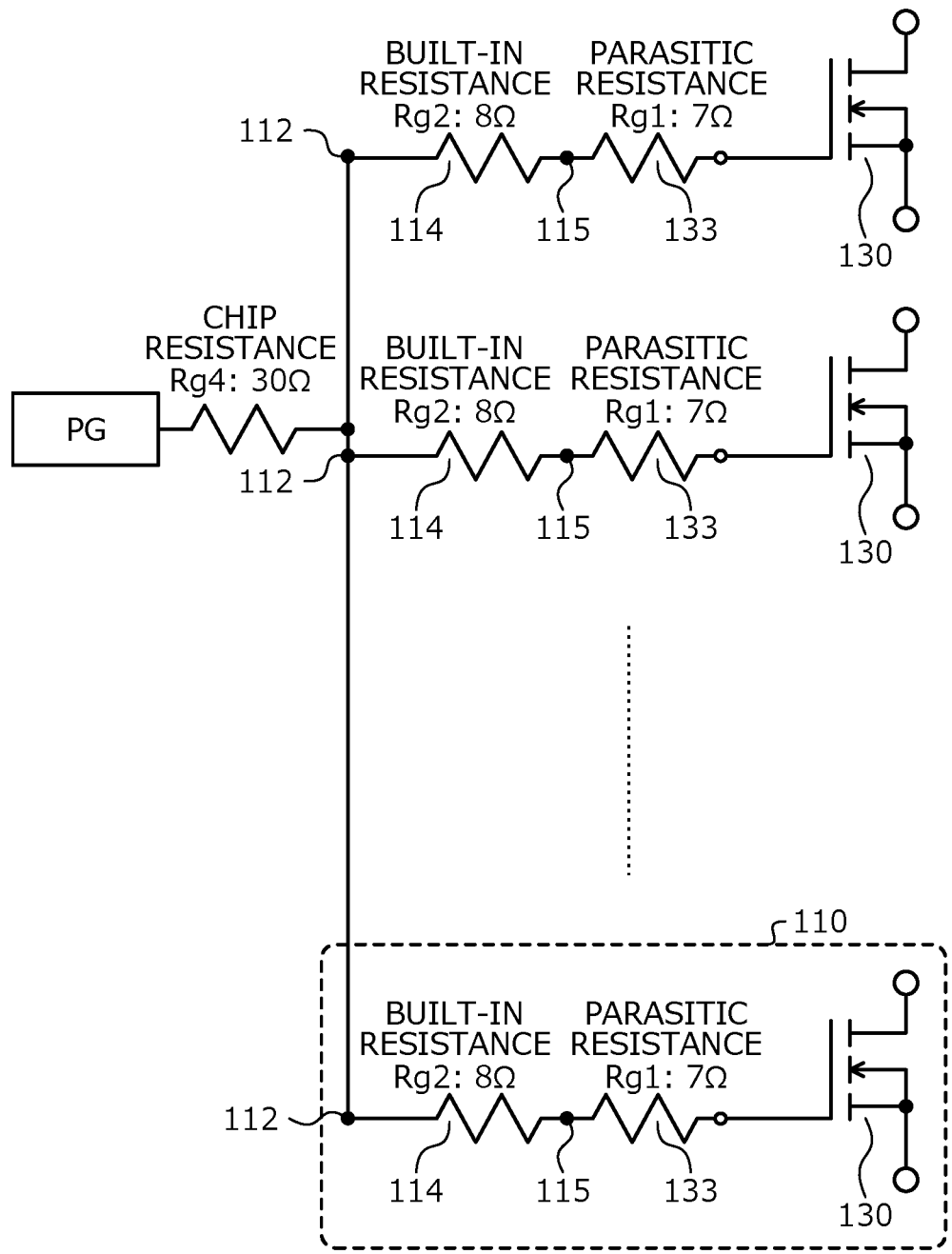
FIG. 11 is a circuit diagram depicting an example of an equivalent circuit of a semiconductor circuit device in which the semiconductor device depicted in FIG. 10 is provided in plural and connected in parallel.
Figure 12:
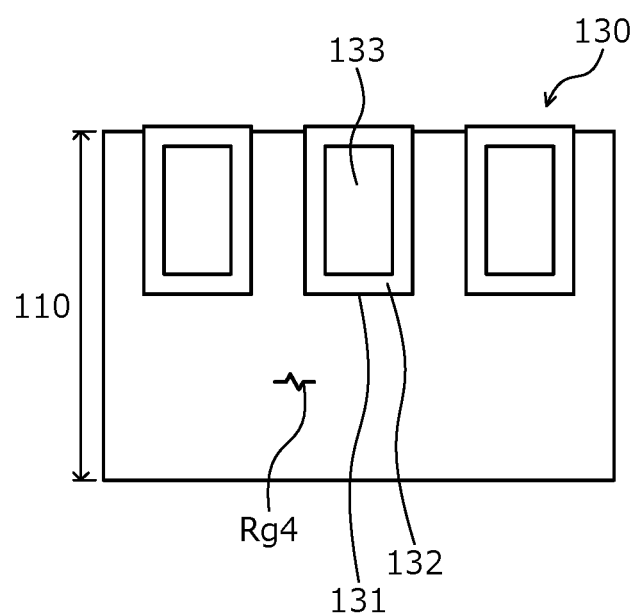
FIG. 12 is a cross-sectional view schematically depicting a structure of one semiconductor chip of the semiconductor circuit device depicted in FIG. 11.
Figure 13:
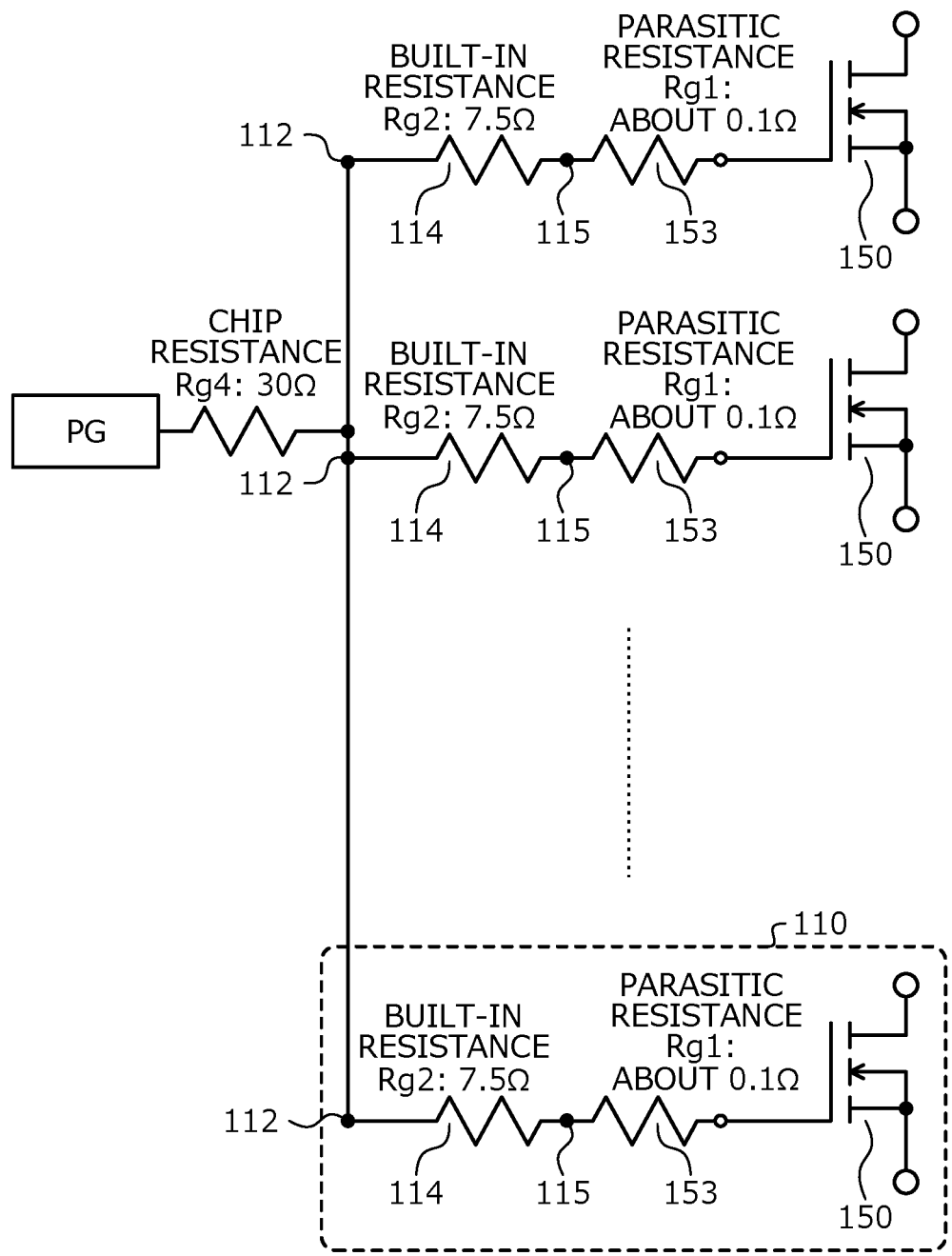
FIG. 13 is a circuit diagram depicting an example of an equivalent circuit of a semiconductor circuit device in which the semiconductor device depicted in FIG. 10 is provided in plural and connected in parallel.
Figure 14:
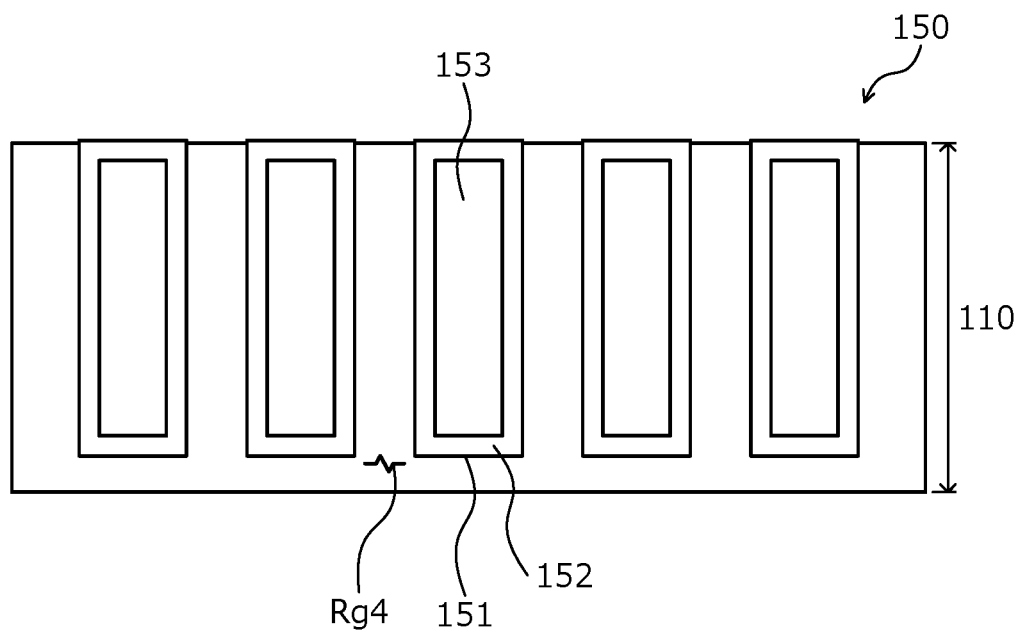
FIG. 14 is a cross-sectional view schematically depicting a structure of one semiconductor chip of the semiconductor circuit device depicted in FIG. 13.

First, problems associated with the conventional techniques will be described. The following problems arise with the described conventional semiconductor device (refer to FIG. 10). FIGS. 11 and 13 are circuit diagrams depicting an example of an equivalent circuit of a semiconductor circuit device in which the semiconductor device depicted in FIG. 10 is provided in plural and connected in parallel. FIGS. 12 and 14 are cross-sectional views schematically depicting a structure of one semiconductor chip of the semiconductor circuit device depicted in FIGS. 11 and 13. FIGS. 11 and 12 depict a case in which silicon carbide (SiC) is used as a material of the semiconductor substrate (semiconductor chip) 110.

FIGS. 13 and 14 depict a case in which the semiconductor device depicted in FIG. 10 is applied to an insulated gate bipolar transistor (IGBT) that uses silicon (Si) as a material. In FIGS. 12 and 14, parts of MOSFETs 130, 150 formed in the semiconductor substrate 110 other than gate trenches 131, 151, gate insulating films 132, 152, and gate electrodes 133, 153 are not depicted.

In the semiconductor circuit device depicted in FIG. 11, the semiconductor device depicted in FIG. 10 is provided in plural and connected in parallel, and each of the semiconductor substrates 110 has an equivalent circuit in which the parasitic resistance Rg1 due to the gate electrode 133 and the built-in resistance Rg2 due to the gate poly-silicon layer 114 added on the semiconductor substrate 110 are connected in series between a protective ground (PG) and the gate electrode 133 of the MOSFET 130 that is fabricated (manufactured) on the semiconductor substrate 110.

Parallel connection of the semiconductor devices depicted in FIG. 10 realizes a predetermined current amount. In each of the semiconductor substrates 110, ends of the gate poly-silicon layer 114 where the built-in resistance Rg2 occurs are connected to the gate pad 112 and the second measurement pad 115, respectively. Reference character Rg4 represents chip resistance Rg4 occurring between the PG and the gate poly-silicon layer 114 where the built-in resistance Rg2 occurs. The chip resistance Rg4 occurs due to the semiconductor substrate 110 and, for example, is about 30Ω.

When silicon carbide is used as a material of the semiconductor substrate 110, the semiconductor substrate 110 has a chip size that is small and, for example, is about 3 mm². The gate trenches 131 are few in number and shallow, and since a volume of the poly-silicon constituting each of the gate electrodes 133 is small, the resistance value of the parasitic resistance Rg1 due to the gate electrode 133 is large (FIG. 12). Further, a quantity of the semiconductor substrates 110 connected in parallel to obtain a predetermined current amount is large.

At each of the semiconductor substrates 110, in controlling variation of the overall gate resistance Rg3, the resistance value of the built-in resistance Rg2 of each of the semiconductor substrates 110 has to be increased. Nonetheless, when the resistance value of the parasitic resistance Rg1 is large, and the resistance value of the parasitic resistance Rg1 and the resistance value of the built-in resistance Rg2 become resistance values that are close to each other, the overall gate resistance Rg3 cannot be determined by the resistance value of the built-in resistance Rg2.

In particular, for example, when the resistance value of the parasitic resistance Rg1 and the resistance value of the built-in resistance Rg2 are about 7Ω and about 8Ω, respectively, the overall gate resistance Rg3 is about 15Ω(=7Ω+8Ω). Therefore, when the resistance value of the parasitic resistance Rg1 varies at each of the semiconductor substrates 110, the resistance value of the overall gate resistance Rg3 cannot be controlled by the resistance value of the built-in resistance Rg2 and variation of the resistance value of the overall gate resistance Rg3 at each of the semiconductor substrates 110 occurs.

On the other hand, the semiconductor circuit device depicted in FIG. 13 for comparison has a configuration that is substantially identical to that of the semiconductor circuit device depicted in FIG. 11. In other words, each of the semiconductor substrates 110 has an equivalent circuit in which the gate electrode 153 where the parasitic resistance Rg1 occurs and the gate poly-silicon layer 114 that is on the semiconductor substrate 110 and where the built-in resistance Rg2 occurs are connected in series between the PG and the gate electrode 153 of the IGBT 150 that is fabricated on the semiconductor substrate 110.

When the IGBT 150 is fabricated on the semiconductor substrate 110 in which silicon is used as a material, the semiconductor substrate 110 has a chip size that is large and, for example, is about 10 mm². The gate trenches 151 are large in number and are deep, and since a volume of the poly-silicon constituting each of the gate electrodes 153 is large, the resistance value of the parasitic resistance Rg1 due to the gate electrode 153 is small (FIG. 14). Additionally, a quantity of the semiconductor substrates 110 connected in parallel obtain a predetermined current amount is small.

To control variation of the overall gate resistance Rg3, in each of the semiconductor substrates 110, the resistance value of the built-in resistance Rg2 suffices to be about 10 times higher than the resistance value of the parasitic resistance Rg1. For example, since the resistance value of the parasitic resistance Rg1 and the resistance value of the built-in resistance Rg2 are on an order of about 0.1Ω and about 7.5Ω, respectively, the resistance value of the overall gate resistance Rg3 is substantially equal to the resistance value of the built-in resistance Rg2.

In this manner, when the resistance value of the parasitic resistance Rg1 is low, the resistance value of the overall gate resistance Rg3 may be determined by the resistance value of the built-in resistance Rg2. On the other hand, when the resistance value of the parasitic resistance Rg1 is high like the semiconductor circuit device depicted in FIG. 11, as described above, the overall gate resistance Rg3 cannot be determined by the resistance value of the built-in resistance Rg2 and therefore, the resistance value of the overall gate resistance Rg3 cannot be obtained by measuring only the resistance value of the built-in resistance Rg2 by the second measurement pad 115.

Further, while the resistance value of the parasitic resistance Rg1 may be measured by a general inductance (l) capacitance (c) and resistance (r) (LCR) meter, measurement accuracy is low and, for example, when a set value is 7Ω, about 6.5Ω to 9.5Ω is measured and thus, variation is large and the measured value is not reliable. Therefore, even when the resistance value of the parasitic resistance Rg1 is measured, the resistance value of the overall gate resistance Rg3 cannot be obtained.

In this manner, an accurate resistance value of the overall gate resistance Rg3 cannot be obtained and thus, when the resistance value of the parasitic resistance Rg1 in each of the semiconductor substrates 110 connected in parallel varies, the resistance value of the overall gate resistance Rg3 in each of the semiconductor substrates 110 also varies. Among the semiconductor substrates 110 connected in parallel are semiconductor substrates 110 having differing switching timings and therefore, switching noise cannot be reduced.

Embodiments of a semiconductor device according to the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively. In the description of the embodiments below and the accompanying drawings, main portions that are identical will be given the same reference numerals and will not be repeatedly described.

Figure 1:
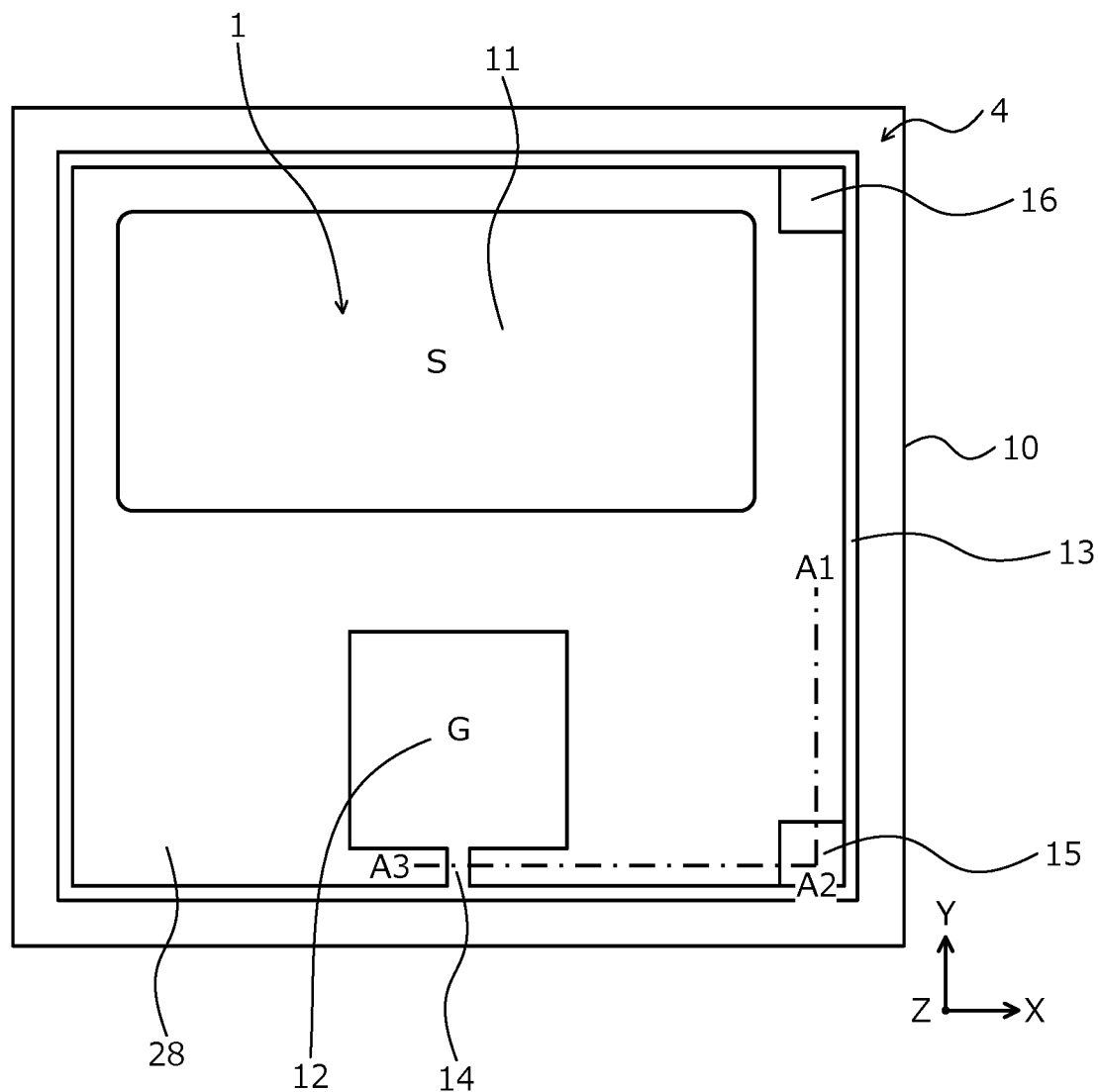
FIG. 1 is a plan view of a layout when a semiconductor device according to a first embodiment is viewed from a front surface side of a semiconductor substrate.

A structure of the semiconductor device according to a first embodiment will be described taking a MOSFET as an example. FIG. 1 is a plan view of a layout when the semiconductor device according to the first embodiment is viewed from a front surface side of a semiconductor substrate. The semiconductor device according to the first embodiment and depicted in FIG. 1 is a semiconductor device in which a gate poly-silicon layer 14 where the built-in resistance Rg2 (refer to FIG. 3) occurs is disposed on a semiconductor substrate (semiconductor chip) 10 having the MOSFET. The semiconductor substrate 10, for example, is made from silicon carbide (SiC) and has a chip size of about 3 mm$^2$, for example. On a front surface of the semiconductor substrate 10, a source pad 11, a gate pad 12, and first and second measurement pads 15, 16 are disposed separated from each other and are electrically insulated from each other by a passivation film 28.

The source pad 11, the gate pad 12, and the first and the second measurement pads 15, 16, for example, are metal layers that have a substantially rectangular planar shape and are disposed at a same layer level in a same stacked structure. The source pad 11 is disposed at substantially an entire surface of an effective region 2 in an active region 1. A surface of the source pad 11 is covered by the passivation film 2, except at a bonding site for a bonding wire. The effective region 2 is a region other than an inactive region 3 in the active region 1, is a region in which a unit cell (constituent unit of an element) of the MOSFET is disposed, and functions as the MOSFET. The inactive region 3 is a region that does not function as the MOSFET and in which no unit cell of the MOSFET is disposed.

The gate pad 12 and the first and the second measurement pads 15, 16 are disposed in the inactive region 3 that is in the active region 1. The gate pad 12 and a gate finger 13 are electrically connected via the gate poly-silicon layer 14. The gate finger 13 is provided along a boundary between an edge termination region 4 and the active region 1, has a substantially rectangular shape, and surrounds a periphery of the active region 1. The gate finger 13 is electrically connected to all gate electrodes 23 (refer to FIGS. 2, 3). The gate electrodes 23, for example, are connected to the gate finger 13, at each end of each gate trench 21 that is provided in a striped shape that extends along a direction (hereinafter, first direction) X parallel to the front surface of the semiconductor substrate 10.

The gate finger 13 is a poly-silicon layer that is disposed at the same layer level as the gate poly-silicon layer 14. The gate finger 13 may be directly connected to the gate poly-silicon layer 14 or may be electrically connected to the gate poly-silicon layer 14 via a contact electrode (not depicted). The gate poly-silicon layer 14 where the built-in resistance Rg2 occurs and the gate electrodes 23 having poly-silicon as a material and as a consequence where the parasitic resistance Rg1 occurs are connected in series by the gate finger 13. The combined resistance of the built-in resistance Rg2 and the parasitic resistance Rg1 is the overall gate resistance Rg3 of the semiconductor device according to the first embodiment. Two electrode pads (the first and the second measurement pads 15, 16) for measuring resistance values are separated from each other and are connected to the gate finger 13.

The first measurement pad (second electrode pad for measuring a second resistance value) 15 is connected between a connection point that is closest to the gate poly-silicon layer 14 of connection points between the gate finger 13 and the gate electrodes 23 and a connection point between the gate finger 13 and the gate poly-silicon layer 14. As a result, the gate poly-silicon layer 14 where the built-in resistance Rg2 occurs is connected between the first measurement pad 15 and the gate pad 12. Therefore, the resistance value of the built-in resistance Rg2 (the second resistance value) may be measured by the first measurement pad 15. The first measurement pad 15 may be omitted.

The second measurement pad (an electrode pad for measuring a first resistance value) 16 is connected to the gate finger 13, at a position farther from the gate poly-silicon layer 14 than is a connection point that is farthest from the gate poly-silicon layer 14 of the connection points between the gate finger 13 and the gate electrodes 23. The gate electrodes 23 where the parasitic resistance Rg1 occurs and the gate poly-silicon layer 14 where the built-in resistance Rg2 occurs are connected in series between the second measurement pad 16 and the gate pad 12. Therefore, the resistance value of the overall gate resistance Rg3 (the first resistance value) that is the combined resistance of the built-in resistance Rg2 and the parasitic resistance Rg1 may be measured by the second measurement pad 16.

In particular, the first and the second measurement pads 15, 16, for example, are disposed at respectively different corner portions of the active region 1 and are each connected to the gate finger 13 at the respective corner portion of the active region 1. The first measurement pad 15, for example, is connected to the gate finger 13 at the corner portion that of the four corner portions of the active region 1, is closest to the gate poly-silicon layer 14. The second measurement pad 16, for example, is connected to the gate finger 13, at the corner portion that of the four corner portions of the active region 1, is farthest from the gate poly-silicon layer 14 and that shares a side with the corner portion where the first measurement pad 15 is disposed. A corner portion of the active region 1 is a vertex of the active region 1 that has a substantially rectangular planar shape. After measurement of the resistance values, the first and the second measurement pads 15, 16 are covered by a non-depicted insulator. Thus, reliability of the semiconductor chip as a product may be enhanced.

Figure 2:
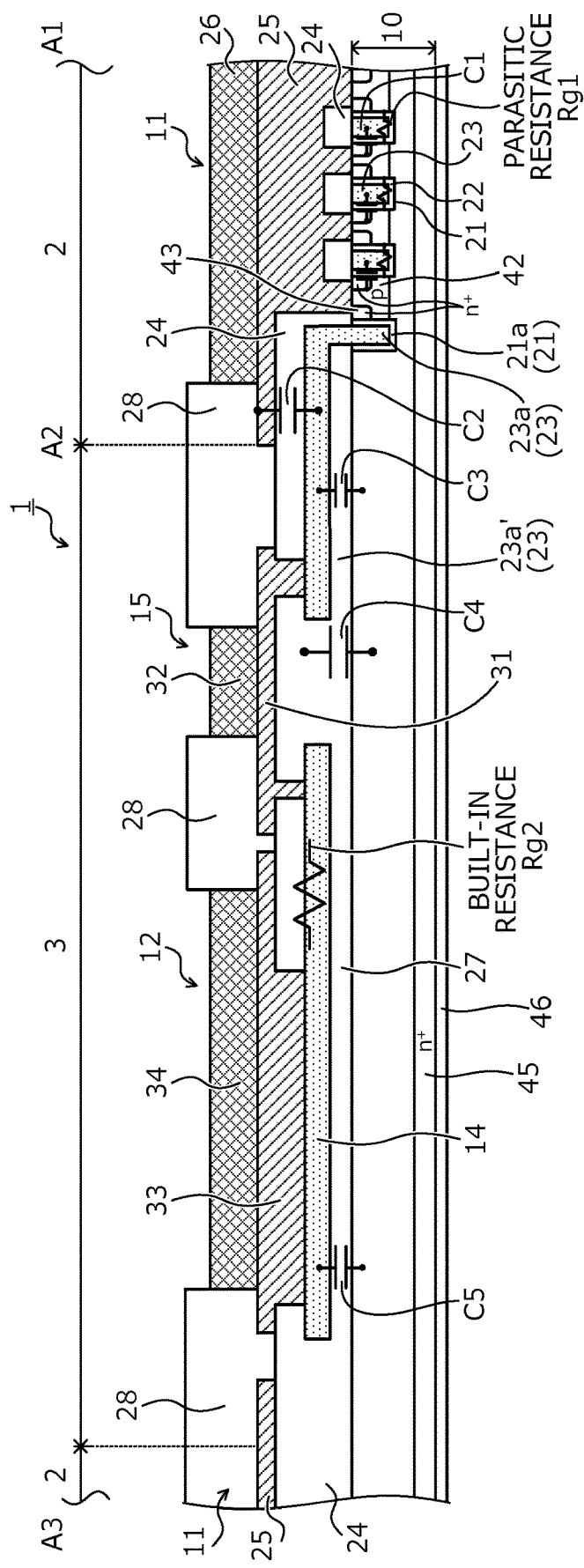
FIG. 2 is a cross-sectional view of a structure along cutting lines A1-A2 and A2-A3 depicted in FIG. 1.
Figure 3:
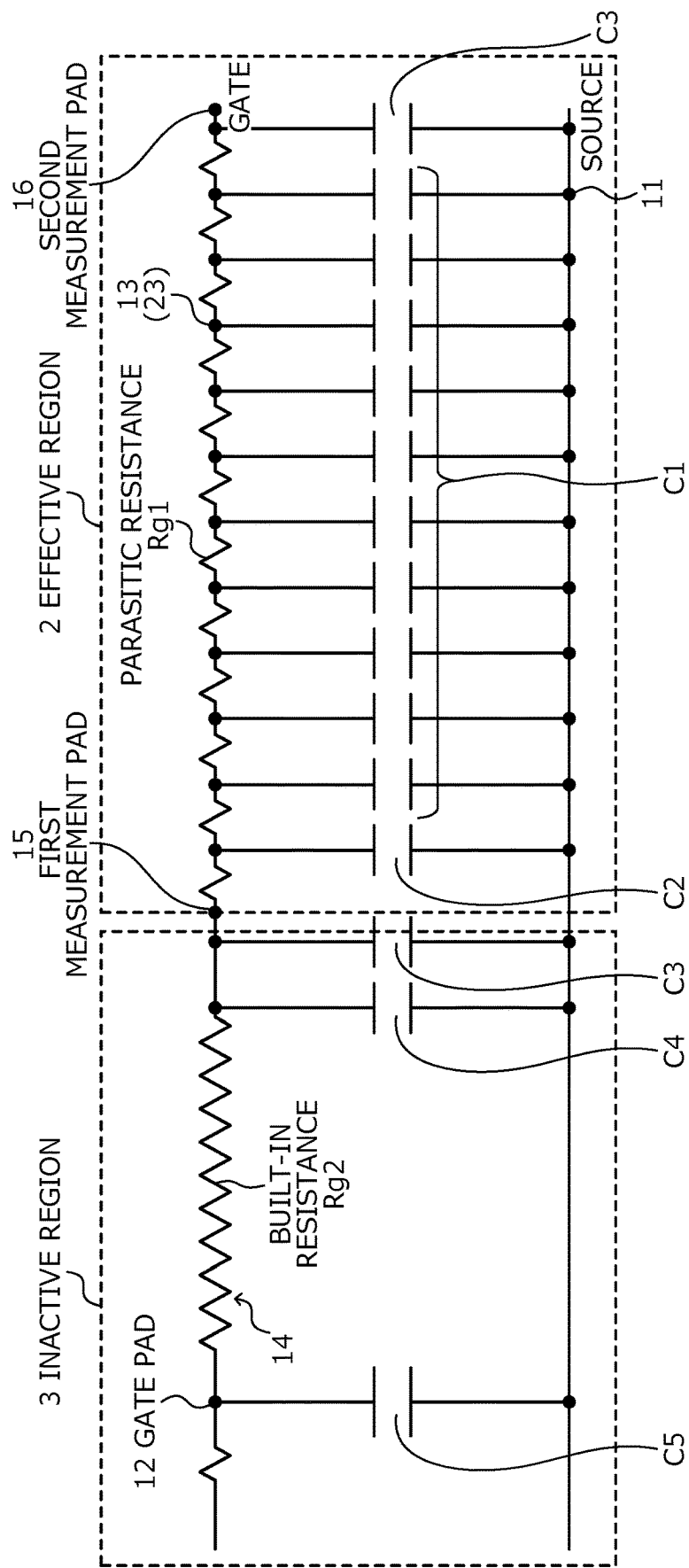
FIG. 3 is a circuit diagram depicting an equivalent circuit of a circuit configuration depicted in FIG. 2.

A cross-sectional view of the structure of the semiconductor device according to the first embodiment will be described. FIG. 2 is a cross-sectional view of the structure along cutting lines A1-A2 and A2-A3 depicted in FIG. 1. Cutting line A1-A2 in FIG. 1 is a cutting line that passes through the first measurement pad 15 and the active region 1 along a direction (hereinafter, second direction) Y that is parallel to the front surface of the semiconductor substrate 10 and orthogonal to a first direction X. Cutting line A2-A3 in FIG. 1 is a cutting line that passes through the gate poly-silicon layer 14 and the first measurement pad 15 and cuts the active region 1 along the first direction X. In FIG. 2, semiconductor regions that are provided in the semiconductor substrate 10 are not depicted. FIG. 3 is a circuit diagram depicting an equivalent circuit of the circuit configuration depicted in FIG. 2.

As depicted in FIG. 2, in the effective region 2 of the active region 1, at the front surface of the semiconductor substrate 10, MOSFET unit cells having a general trench gate structure are disposed in a striped shape and extend along the first direction X (refer to FIG. 1). The trench gate structure is constituted by a p-type base region (first semiconductor region) 42, an n$^+$-type source region (second semiconductor region) 43, a trench (the gate trench 21), a gate insulating film 22, and the gate electrode 23. The p-type base region and n$^+$-type source region are provided between adjacent gate trenches 21 (in a mesa region). The gate electrode 23 is electrically connected to the gate finger 13 at each end the gate trench 21. The gate electrode 23 is made from poly-silicon.

An interlayer insulating film 24 is provided at the front surface of the semiconductor substrate 10 so as to cover the gate electrode 23. A source electrode 25 is electrically connected to the p-type base region and the n$^+$-type source region via a contact hole in the interlayer insulating film 24. The source electrode 25 constitutes the source pad 11. The source electrode 25, for example, may have a stacked structure in which a titanium (Ti) film, a titanium nitride (TiN) film, and an aluminum-silicon (AlSi) film are sequentially stacked. A surface of the source electrode 25 other than at a portion of the source electrode 25 covered by the passivation film 28, for example, is covered by a nickel (Ni) plated film 26.

In the inactive region 3 of the active region 1, the front surface of the semiconductor substrate 10 is covered by a field oxide film 27. On the field oxide film 27, a gate electrode 23a extends from inside a gate trench 21a (21) that is closest to the first measurement pad 15. A portion (hereinafter, extended portion) 23a' of the gate electrode 23a, the portion 23a' that extends on the field oxide film 27, terminates in the inactive region 3. The extended portion 23a' of the gate electrode 23a, for example, opposes a portion of the source electrode 25 and a portion of a metal electrode 31 described hereinafter, across the interlayer insulating film 24 in a depth direction Z. The extended portion 23a' of the gate electrode 23a is electrically connected to the gate finger 13 at a non-depicted portion and is fixed at a gate potential. The extended portion 23a' of the gate electrode 23a may be fixed at a source potential.

Further, on the field oxide film 27, the gate poly-silicon layer 14 is provided separated from the extended portion 23a' of the gate electrode 23a. The gate poly-silicon layer 14 opposes a portion of the metal electrode 31 and a metal electrode 33 described hereinafter, across the interlayer insulating film 24 in the depth direction Z. The gate poly-silicon layer 14 and the extended portion 23a' of the gate electrode 23a are covered by the interlayer insulating film 24. The gate poly-silicon layer 14 and the extended portion 23a' of the gate electrode 23a are electrically connected by the metal electrode 31, via contact holes in the interlayer insulating film 24. Further, the gate poly-silicon layer 14 is connected to the metal electrode 33 via a contact hole in the interlayer insulating film 24; and the metal electrodes 31, 33 are electrically connected to each other via the gate poly-silicon layer 14. The source electrode 25 and the metal electrodes 31, 33 are disposed separated from each other.

The metal electrodes 31, 33, for example, have a stacked structure like that of the source electrode 25.

Surfaces of the metal electrodes 31, 33 other than at portions of the metal electrodes 31, 33 covered by the passivation film 28, for example, are respectively covered by nickel plated films 32, 34. The metal electrodes 31, 33 constitute the first measurement pad 15 and the gate pad 12, respectively. While not depicted, the second measurement pad 16, similarly to the first measurement pad 15, is constituted by the metal electrode 31 and the nickel plated film 34. Additionally, the second measurement pad 16, similarly to the first measurement pad 15, opposes across the interlayer insulating film 24 below in the depth direction Z, the extended portion 23a' of the gate electrode 23a that is disposed closest to the second measurement pad 16. In a surface layer at a rear surface of the semiconductor substrate 10, an n$^+$-type drain region (third semiconductor region) 45 is provided spanning the entire rear surface of the semiconductor substrate 10. A drain electrode 46 is provided at the entire rear surface of the semiconductor substrate 10.

As depicted in FIGS. 2 and 3, between the gate and the source of the unit cells of the MOSFET, parasitic capacitance C1 occurs at a portion of the gate insulating film 22 along the side wall of the gate trench 21. Parasitic capacitance C2 occurs at the interlayer insulating film 24, between the source pad 11 and the extended portion 23a' of the gate electrode 23a. Parasitic capacitance C3 occurs at the field oxide film 27 between the extended portion 23a' of the gate electrode 23a and the front surface of the semiconductor substrate 10. Parasitic capacitance C4 occurs at the field oxide film 27 and the interlayer insulating film 24 between the first measurement pad 15 and the front surface of the semiconductor substrate 10. Parasitic capacitance C5 occurs at the field oxide film 27 between the gate poly-silicon layer 14 and the front surface of the semiconductor substrate 10. A thickness of the interlayer insulating film 24 and a thickness of the field oxide film 27 are adjusted, enabling the parasitic capacitances C1 to C5 to be adjusted.

By increasing the parasitic capacitances C3, C4, electrostatic discharge (ESD) capability of a layer beneath the first and the second measurement pads 15, 16 may be enhanced. By increasing the parasitic capacitance C5, ESD capability of a layer beneath the gate pad 12 may be enhanced. Further, by fixing the poly-silicon layer (the extended portion 23a' of the gate electrode 23a) beneath the first and the second measurement pads 15, 16 at the gate potential or the source potential, the parasitic capacitances C3, C4 may be increased. Regions where the parasitic capacitances C1 to C5 occur are connected in parallel between the gate pad 12 and the source pad 11. Therefore, by increasing any of the parasitic capacitances C1 to C5, overall parasitic capacitance occurring at the interlayer insulating film 24 and the field oxide film 27 may be increased.

As described, according to the first embodiment, the gate electrode where parasitic resistance occurs and the gate poly-silicon layer where built-in resistance occurs are connected in series between the second measurement pad and the gate pad. The resistance value of the overall gate resistance that is the combined resistance of the built-in resistance and the parasitic resistance may be measured by the second measurement pad. As a result, an accurate resistance value of the gate resistance between the gate pad and the gate electrode may be obtained and based on the accurate resistance value of the gate resistance, semiconductor chips (semiconductor substrates) may be sorted into a predetermined class of substantially equal resistance values of 0 gate resistance. Therefore, when plural semiconductor chips are connected in parallel, semiconductor chips having substantially the same switching timing may be selected and used, thereby enabling switching noise to be reduced.

A structure of the semiconductor device according to a second embodiment will be described. FIGS. 4A, 4B, 5A, 5B, 6A, and 6B are cross-sectional views depicting examples of the structure of the semiconductor device according to the second embodiment. In FIGS. 4A, 4B, 5A, 5B, 6A, and 6B, the gate trench 21 is depicted by a finer line than that for the gate finger 13. Further, in FIGS. 4A, 4B, 5A, 5B, 6A, and 6B, a portion further outward (closer to an edge of the semiconductor substrate 10) than is the gate finger 13 is not depicted. In the semiconductor device according to the second embodiment, disposal of the gate finger 13 differs from that in the semiconductor device according to the first embodiment. The gate finger 13 suffices to be electrically connected in a sequence of the gate pad 12, the gate poly-silicon layer 14, the gate finger 13, the gate electrodes 23, the gate finger 13 and the second measurement pad 16, and disposal thereof may be variously modified.

In particular, for example, as depicted in FIG. 4A, the gate trench 21 is disposed in a striped shape that extends along the first direction X. The gate pad 12 is disposed near one side of the active region 1, at substantially a center of the one side that is parallel to the first direction X. The second measurement pad 16 is disposed at a corner portion of the active region 1, the corner portion constituted by an end portion of a side that opposes the one side near the gate pad 12. At each of a pair of opposing sides of the active region 1, the pair of opposing sides orthogonal to the one side near the gate pad 12, the gate finger 13 (13a, 13b) is disposed extending along each of the opposing sides, in a direction substantially parallel to the second direction Y. Ends of each of the gate electrodes 23 are electrically connected to the different gate fingers (first and second gate fingers) 13a, 13b, respectively.

The gate finger 13a forms a substantially L-shape extending along the one side near the gate pad 12, from one of the pair of opposing sides of the active region 1 orthogonal to the one side near the gate pad 12. The gate pad 12 is electrically connected to an end of the gate finger 13a, via the gate poly-silicon layer 14. The gate finger 13a electrically connects the gate poly-silicon layer 14 and the gate electrodes 23. The second measurement pad 16 is not connected to the gate finger 13a. The gate finger 13b has a substantially linear planar shape extending along the other of the pair of opposing sides that are orthogonal to the one side near the gate pad 12. The second measurement pad 16 is electrically connected to an end of the gate finger 13b. The gate finger 13b electrically connects the second measurement pad 16 and the gate electrodes 23. The gate pad 12 is not connected to the gate finger 13b.

Therefore, in the semiconductor device according to the second embodiment and depicted in FIG. 4A, the gate pad 12, the gate poly-silicon layer 14, the gate finger 13a, the gate electrodes 23 in the gate trenches 21, the gate finger 13b, and the second measurement pad 16 are electrically connected in the order stated.

When the first measurement pad 15 is disposed, as depicted in FIG. 4B, the first measurement pad 15 is disposed at a corner portion of the active region 1, diagonally opposing the corner portion where the second measurement pad 16 is disposed, and the first measurement pad 15 is electrically connected to the gate finger 13a.

Figure 5A:
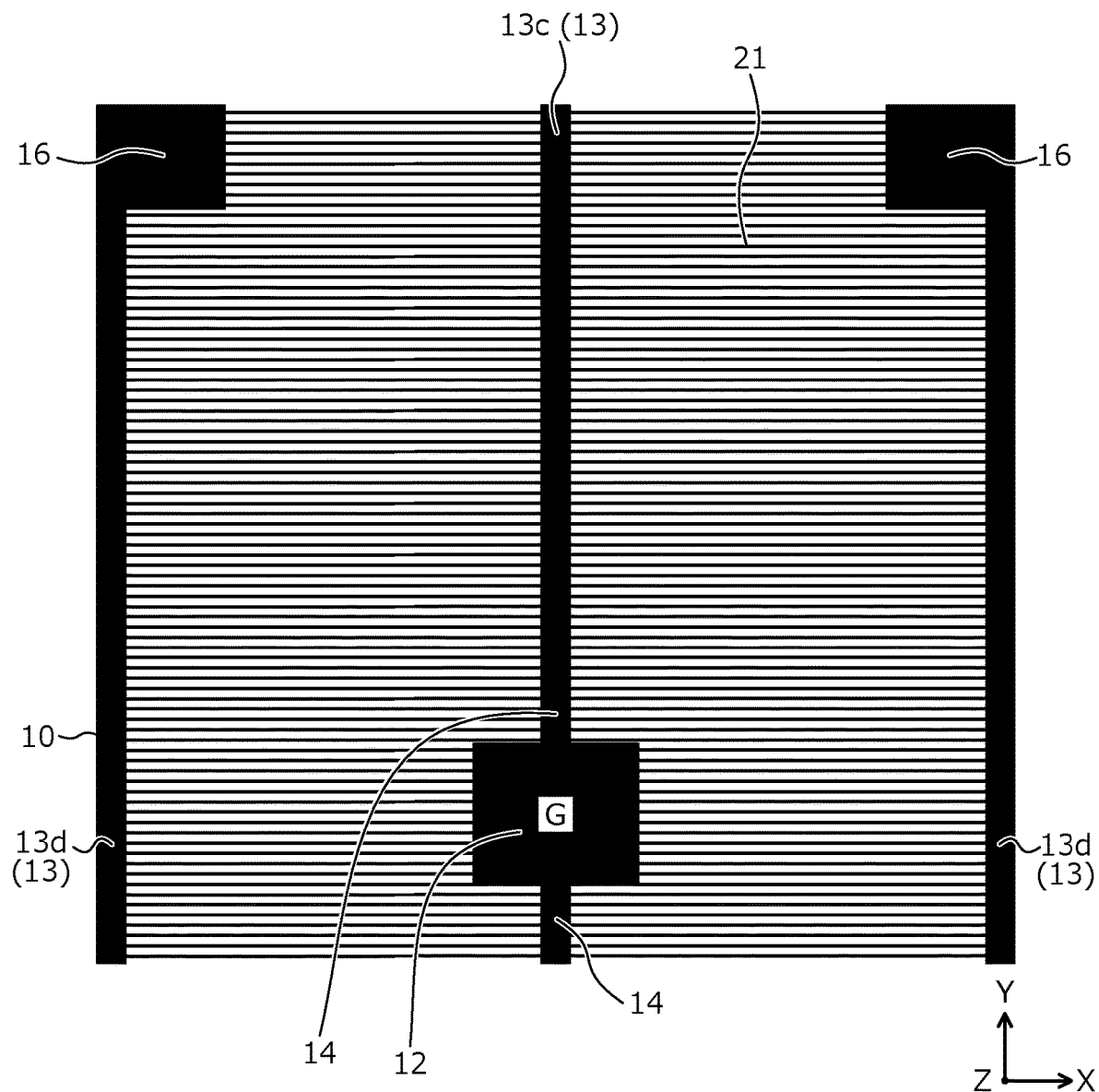
FIG. 5A is a cross-sectional view depicting an example of the structure of the semiconductor device according to the second embodiment.

Further, as depicted in FIG. 5A, two of the second measurement pads 16 may be disposed separated from each other. Disposal of the gate trenches 21 and the gate pad 12 is similar to that in the semiconductor device according to the second embodiment and depicted in FIG. 4A. The two second measurement pads 16 are respectively disposed at each of the corner portions that are respectively constituted by end portions of the side of the active region 1, opposing the one side near the gate pad 12. The gate finger 13 (13c) is provided in a substantially linear planar shape that extends parallel to the second direction Y and passes through a substantially central portion of the active region 1. At each of the pair of opposing sides of the active region 1, the pair of opposing sides orthogonal to the one side near the gate pad 12, the gate finger 13 (13d) is further disposed in a linear shape extending substantially parallel to the second direction Y, along each of the pair of opposing sides. A substantially central portion of each of the gate electrodes 23 is electrically connected to the gate finger 13c while ends of each of the gate electrodes 23 are electrically connected to the different gate fingers 13d, respectively.

Via the gate poly-silicon layer 14, the gate pad 12 is electrically connected to an end of the gate finger 13c that passes through substantially a center of the active region 1. The gate finger 13c electrically connects the gate poly-silicon layer 14 and the gate electrodes 23. The second measurement pads 16 are not connected to the gate finger 13c. The different second measurement pads 16 are electrically connected, respectively, to the gate fingers 13d that respectively extend along the pair of opposing sides of the active region 1, the pair of opposing sides orthogonal to the one side that is near the gate pad 12. The gate fingers 13d electrically connect the second measurement pads 16 and the gate electrodes 23. The gate pad 12 is not connected to the gate fingers 13d.

Therefore, in the semiconductor device according to the second embodiment and depicted in FIG. 5A, the gate pad 12, the gate poly-silicon layer 14, the gate finger 13c, the gate electrodes 23 in the gate trenches 21, the gate fingers 13d, and the second measurement pads 16 are electrically connected in the order stated, at two sites each, in the active region 1.

Figure 5B:
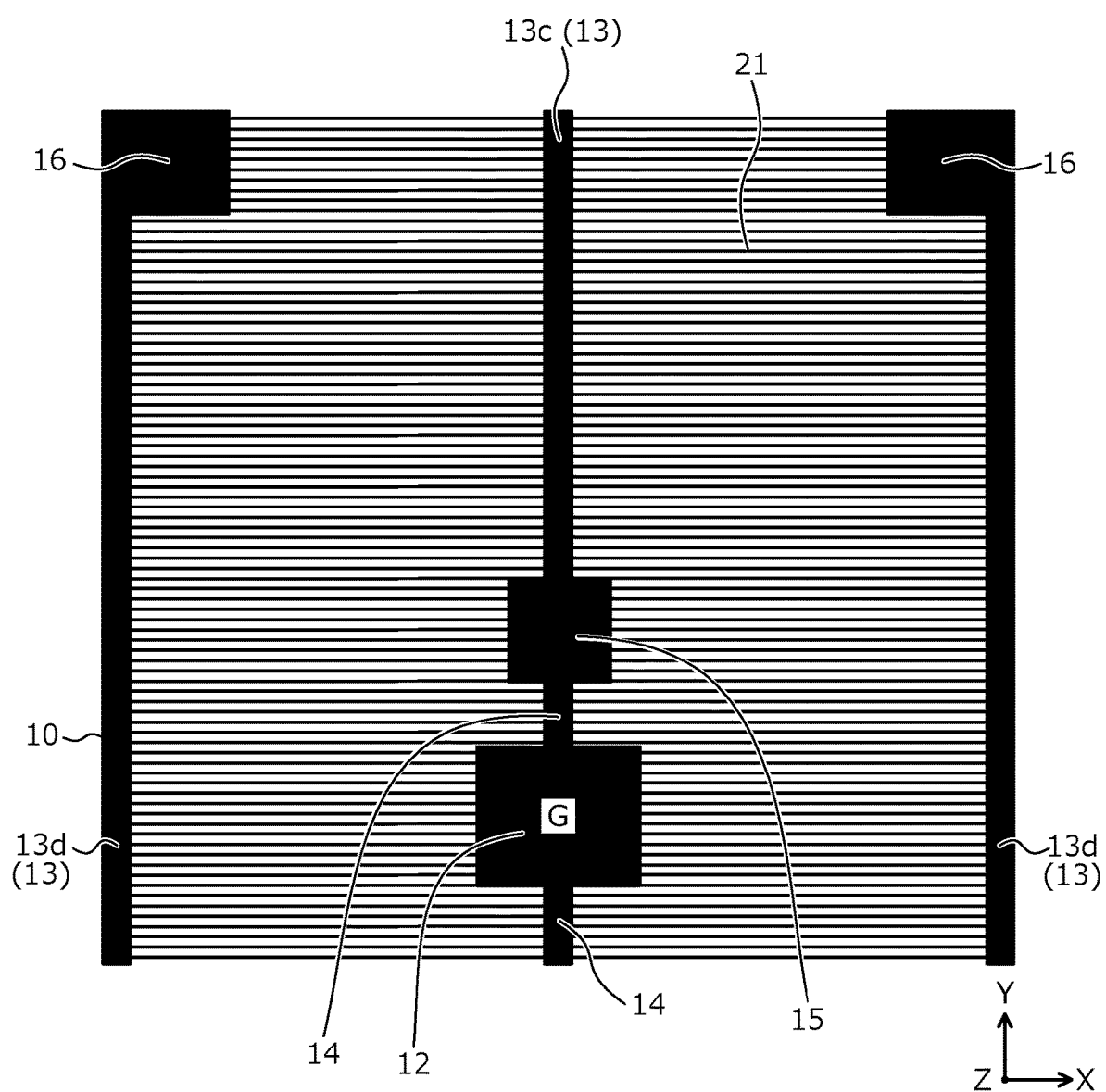
FIG. 5B is a cross-sectional view depicting an example of the structure of the semiconductor device according to the second embodiment.

When the first measurement pad 15 is disposed, as depicted in FIG. 5B, the first measurement pad 15 is disposed near the gate pad 12 in the active region 1, sandwiching the gate finger 13c therebetween, and is electrically connected to the gate finger 13c.

Figure 6A:
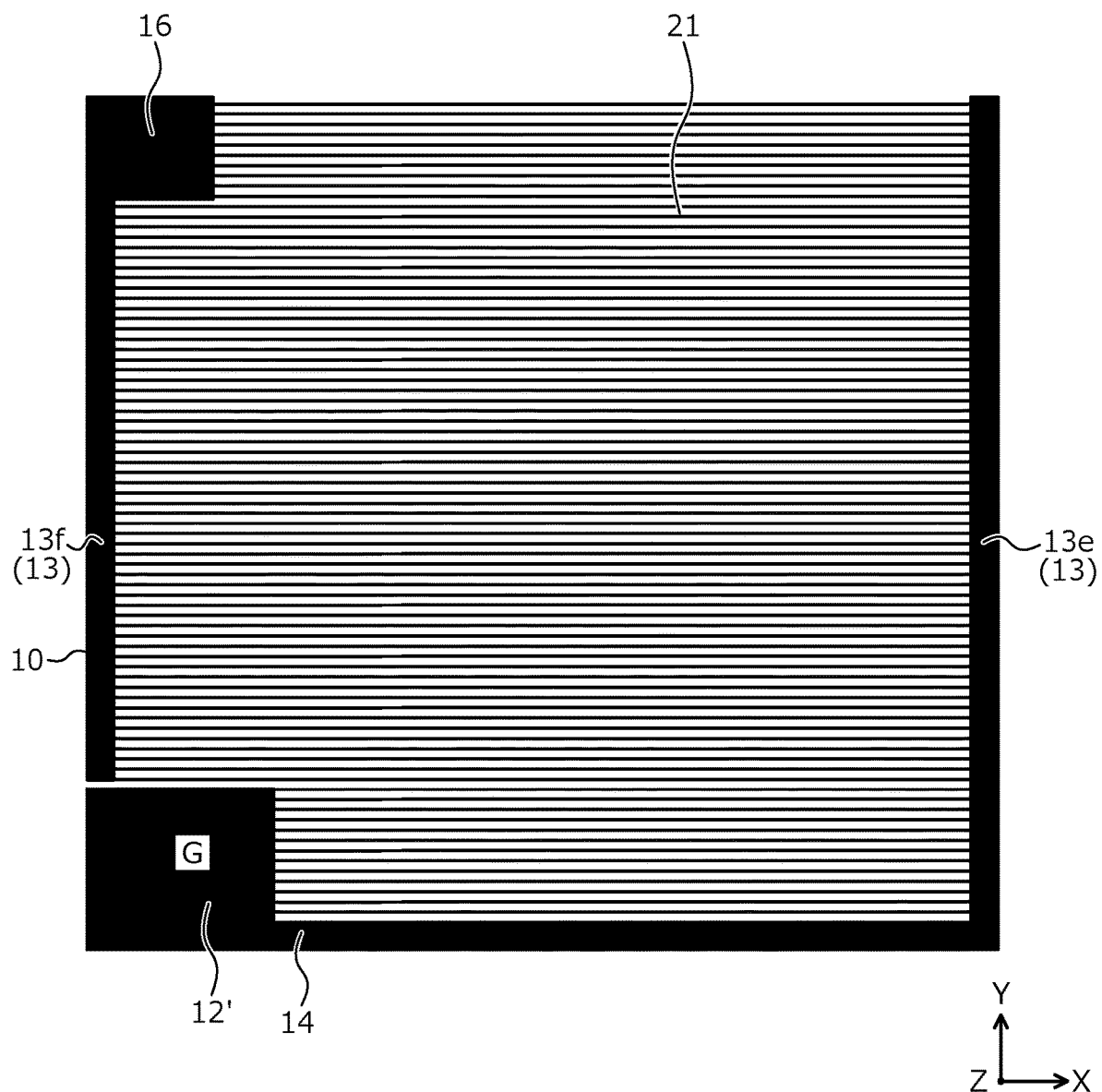
FIG. 6A is a cross-sectional view depicting an example of the structure of the semiconductor device according to the second embodiment.

Further, as depicted in FIG. 6A, in the active region 1, a gate pad 12' and the second measurement pad 16 may be respectively disposed at corner portions that are respectively constituted by end portions of a side of the active region 1, parallel to the second direction Y. Disposal of the gate trenches 21 is similar to that in the semiconductor device according to the second embodiment and depicted FIG. 4A. The gate finger 13 (13e) is disposed extending along two sides of the active region 1, the two sides constituting the corner portion that diagonally opposes the corner portion where the second measurement pad 16 is disposed. The gate finger 13 (13f) is disposed along the side of the active region 1, the side having ends at which the gate pad 12' and the second measurement pad 16 are disposed, respectively. Ends of each of the gate electrodes 23 are electrically connected to the gate fingers 13e, 13f, respectively.

The gate finger 13e has an L-shaped planar shape that extends along the two sides of the active region 1. The gate pad 12' is electrically connected to an end of the gate finger 13e, via the gate poly-silicon layer 14. The gate finger 13e electrically connects the gate poly-silicon layer 14 and the gate electrodes 23. The second measurement pad 16 is not connected to the gate finger 13e. The gate finger 13f has a substantially linear planar shape that extends along the side of the active region 1, the side having ends at which the gate pad 12' and the second measurement pad 16 are disposed, respectively. One end of the gate finger 13f is electrically connected to the second measurement pad 16 while the other end thereof terminates at a position not reaching the gate pad 12'. The gate finger 13f electrically connects the second measurement pad 16 and the gate electrodes 23. The gate pad 12' is not connected to the gate finger 13f.

Therefore, in the semiconductor device according to the second embodiment and depicted in FIG. 6A, the gate pad 12', the gate poly-silicon layer 14, the gate finger 13e, the gate electrodes 23 in the gate trenches 21, the gate finger 13f, and the second measurement pad 16 are electrically connected in the order stated.

Figure 6B:
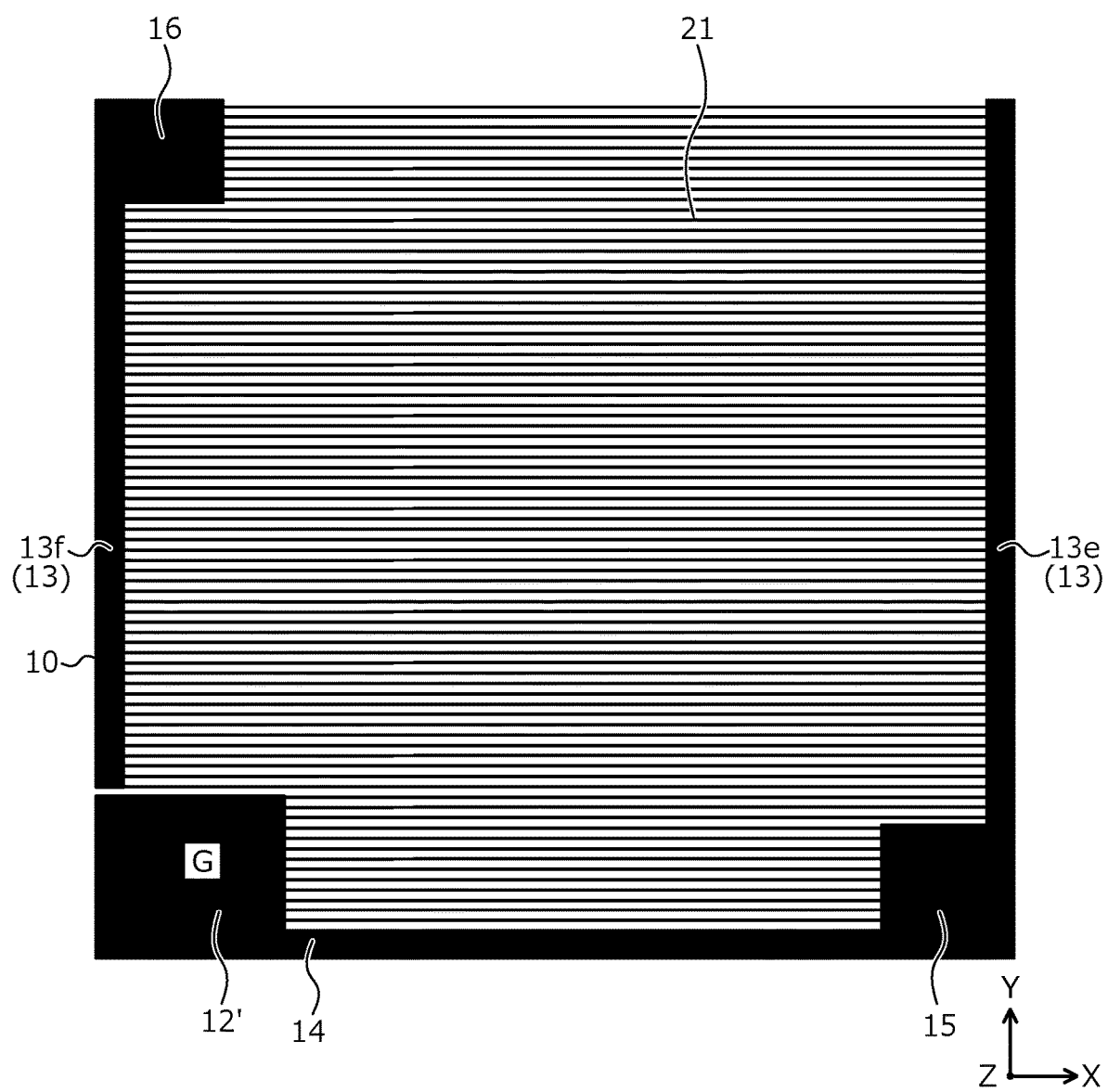
FIG. 6B is a cross-sectional view depicting an example of the structure of the semiconductor device according to the second embodiment.
Figure 7:
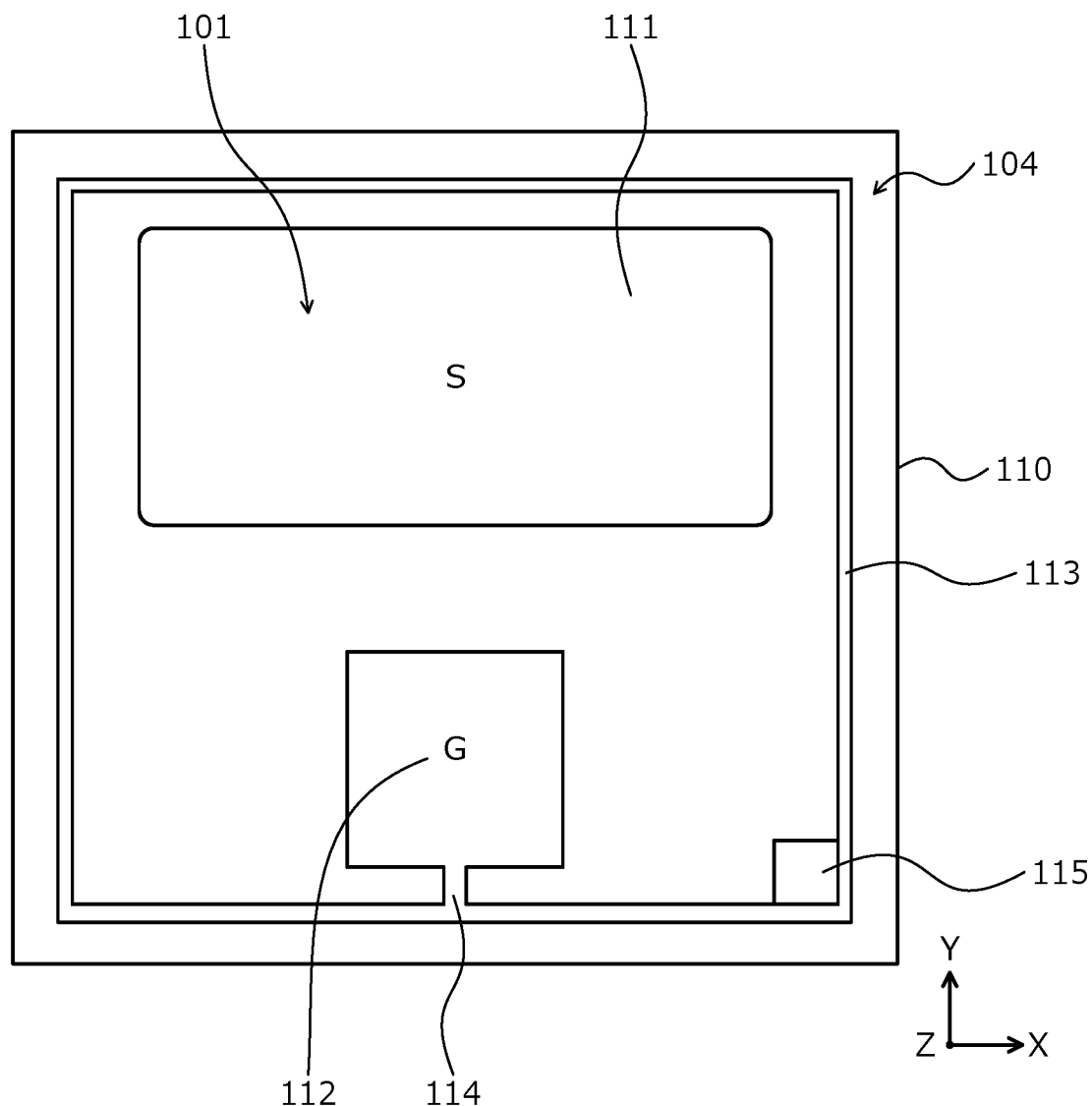
FIG. 7 is a plan view of a layout when a conventional semiconductor device is viewed from a front surface side of a semiconductor substrate.
Figure 8:
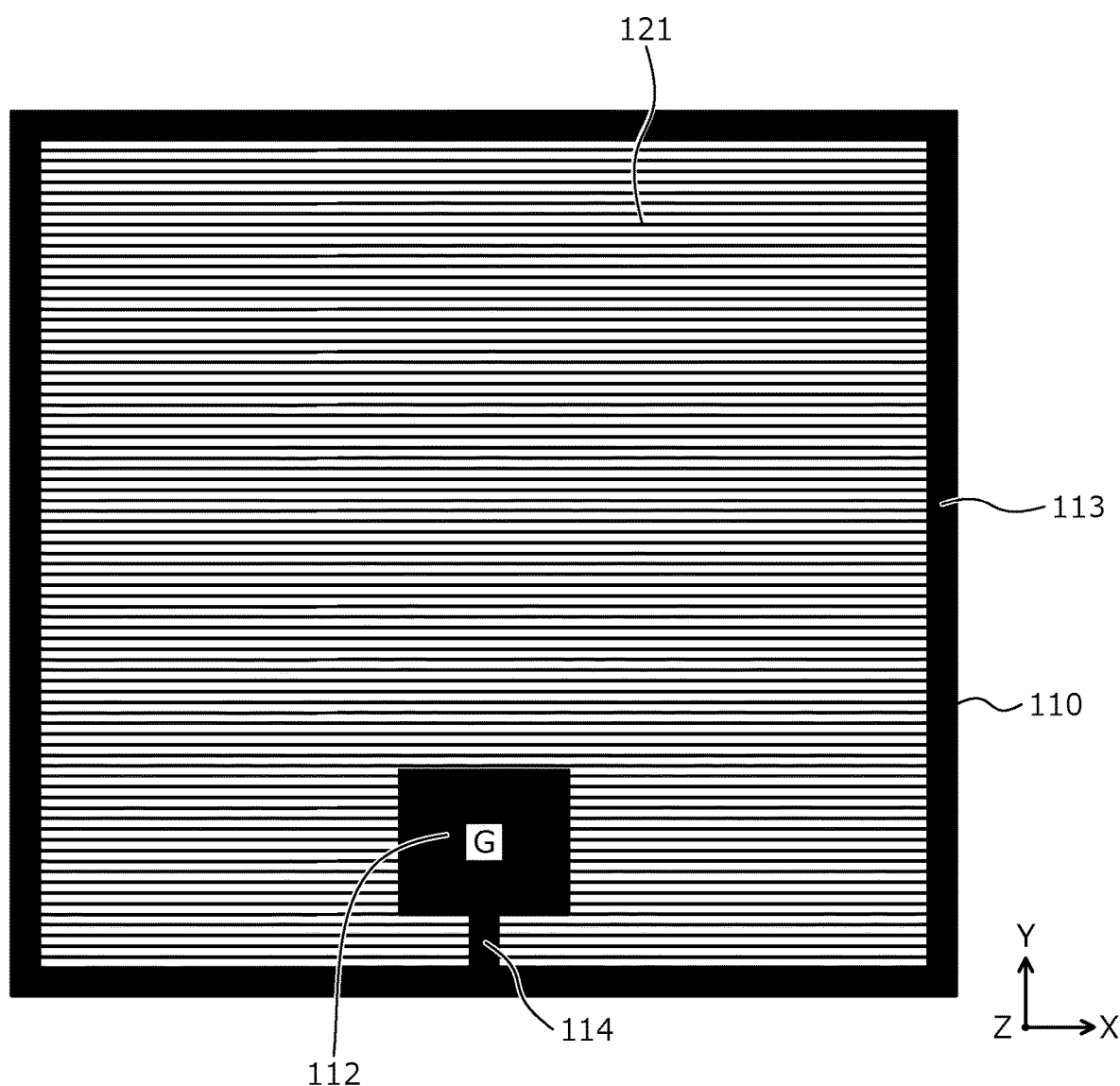
FIG. 8 is a plan view of a layout when the conventional semiconductor device is viewed from a front surface side of a semiconductor substrate.
Figure 9:
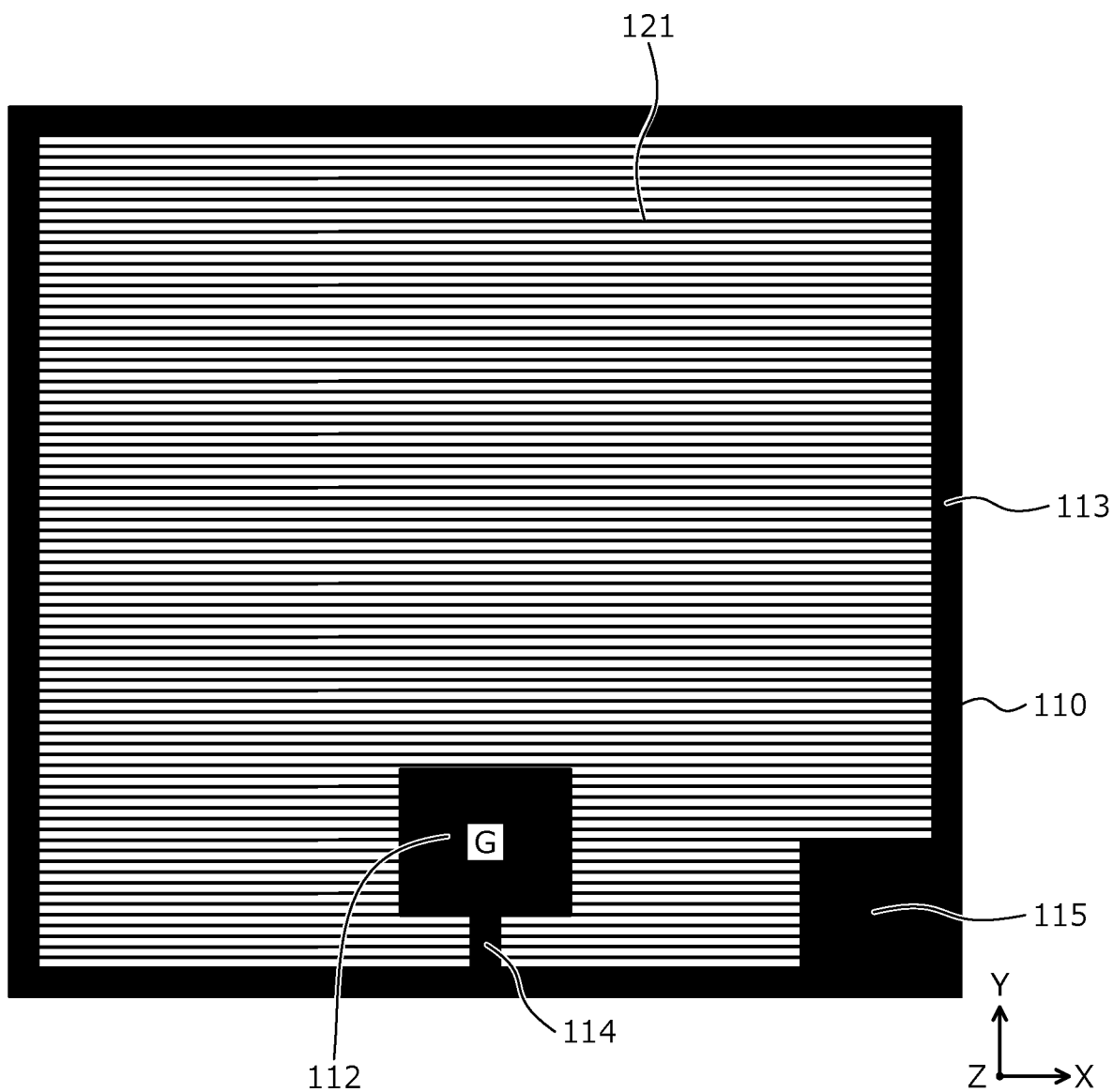
FIG. 9 is a plan view of a layout when the conventional semiconductor device is viewed from a front surface side of a semiconductor substrate.

When the first measurement pad 15 is disposed, as depicted in FIG. 6B, the first measurement pad 15 is disposed at a corner portion of the active region 1, the corner portion that diagonally opposes the corner portion where the second measurement pad 16 is disposed, and the first measurement pad 15 is electrically connected to the gate finger 13e.

As described, according to the second embodiment, effects similar to those of the first embodiment may be obtained irrespective of gate finger disposal.

In the foregoing, the present invention is not limited to the embodiments described above and various modifications within a range not departing from the spirit of the invention are possible. For example, in the embodiments described above, while description has been given taking a MOSFET as an example, application to an IGBT is further possible. Additionally, the present invention is similarly implemented when conductivity types (n-type, p-type) are reversed.

According to the embodiments of the invention, the resistance value (the first resistance value) of the overall gate resistance that is the combined resistance of the gate poly-silicon layer where built-in resistance occurs and the gate electrode where parasitic resistance occurs may be measured by the second measurement pad. As a result, an accurate resistance value of the gate resistance between the gate pad and the gate electrodes may be obtained and based on this accurate resistance value of the gate resistance, the semiconductor chips (semiconductor substrates) may be sorted into a predetermined class of substantially equal gate resistance values. Therefore, when connecting plural semiconductor chips in parallel, semiconductor chips having substantially the same switching timing may be selected and used.

The semiconductor device according to the embodiments of the invention achieves an effect in that switching noise may be reduced.

As described, the semiconductor device according to the embodiments of the invention is useful for MOS semiconductor devices having a trench gate structure in which parasitic resistance due to a gate electrode varies greatly.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A semiconductor device comprising:
   an insulated gate structure provided on a first main surface side of a semiconductor substrate, the insulated gate structure being constituted by a 3-layer structure including a metal film, an oxide film, and a semiconductor material;
   a gate pad provided at a first main surface of the semiconductor substrate, via an insulating film;
   a gate finger provided at the first main surface of the semiconductor substrate, via the insulating film, and to which a plurality of gate electrodes constituted by the metal film of the insulated gate structure is electrically connected;
   a gate poly-silicon layer provided at the first main surface of the semiconductor substrate, via the insulating film, the gate poly-silicon layer electrically connecting the gate pad and the gate finger; and
   an electrode pad for measuring a first resistance value, the electrode pad being provided at the first main surface of the semiconductor substrate, via the insulating film, and electrically connected to the gate finger, wherein
   all gate electrodes of the plurality of gate electrodes are electrically connected between a first connection part and a second part of the gate finger, the first connection part connecting the gate finger and the gate poly-silicon layer, the second connection part connecting the gate finger and the electrode pad.

2. The semiconductor device according to claim 1, wherein
   the insulated gate structure is a trench gate structure that has:
      a trench from the first main surface of the semiconductor substrate, and
      one of the plurality of gate electrodes provided in the trench, via a gate insulating film constituted by the oxide film.

3. The semiconductor device according to claim 1, further comprising
   a second electrode pad for measuring a second resistance value, the second electrode pad being provided at the first main surface of the semiconductor substrate, via the insulating film, and electrically connected to the gate pad, via the gate poly-silicon layer.

4. The semiconductor device according to claim 1, wherein
   the semiconductor device has as the gate finger:
      a first gate finger that electrically connects the gate poly-silicon layer and the plurality of gate electrodes, and
      a second gate finger that electrically connects the plurality of gate electrodes and the electrode pad, and
   the gate pad, the gate poly-silicon layer, the first gate finger, the plurality of gate electrodes, the second gate finger, and the electrode pad are sequentially connected to each other.

5. The semiconductor device according to claim 1, further comprising
   a poly-silicon layer having an electric potential of the plurality of gate electrodes and provided in the insulating film, wherein
   the poly-silicon layer is disposed between the electrode pad and the semiconductor substrate.

6. The semiconductor device according to claim 1, further comprising:
   a first semiconductor region of the semiconductor substrate that is of a first conductivity type, the first semiconductor region being of a second conductivity type and provided between a plurality of trenches;

a second semiconductor region of the first conductivity type and selectively provided in the first semiconductor region;

a third semiconductor region provided at a second main surface of the semiconductor substrate;

a first electrode electrically connected to the first semiconductor region and the second semiconductor region;

a second electrode electrically connected to the third semiconductor region; and a poly-silicon layer having an electric potential of the first electrode and provided in the insulating film, wherein the poly-silicon layer is disposed between the electrode pad and the semiconductor substrate.

7. The semiconductor device according to claim 1, wherein the first resistance value is a combined resistance equal to resistance values of parasitic resistance due to the plurality of gate electrodes and built-in resistance due to the gate poly-silicon layer.

8. The semiconductor device according to claim 3, wherein the second resistance value is a resistance value of built-in resistance due to the gate poly-silicon layer.

9. The semiconductor device according to claim 1, wherein the semiconductor substrate contains silicon carbide.

* * * * *